United States Patent [19]

Nyberg et al.

[11] Patent Number: 4,654,231
[45] Date of Patent: Mar. 31, 1987

[54] VANADIUM DIOXIDE FILM DEPOSITION

[75] Inventors: Glen A. Nyberg, St. Clair Shores, Mich.; Robert A. Buhrman, Ithaca, N.Y.

[73] Assignee: The United States of America as represented by the Secretary of the Navy, Washington, D.C.

[21] Appl. No.: 736,614

[22] Filed: May 21, 1985

[51] Int. Cl.[4] .............................................. C23C 16/40
[52] U.S. Cl. ................................ 427/255.3; 427/162; 427/164; 427/255; 427/314
[58] Field of Search ................. 427/87, 109, 164, 314, 427/166, 162, 255.3, 255, 126.3

[56] References Cited

U.S. PATENT DOCUMENTS

| | | | |
|---|---|---|---|
| 3,208,873 | 9/1965 | Ames et al. | 427/166 |
| 3,658,568 | 4/1972 | Donley | 427/166 |
| 3,850,679 | 11/1974 | Sopko et al. | 427/255.3 |
| 4,400,412 | 8/1983 | Scanlon et al. | 427/87 |

OTHER PUBLICATIONS

Nyberg et al., "Summary Abstract: Preparation and Optical Properties of Reactively Evaporated $VO_2$ Thin Films" J. Vac. Sci. Technol., vol. 2, No. 2, pp. 301–302, 1984.

Primary Examiner—Sadie L. Childs
Attorney, Agent, or Firm—Robert F. Beers; Henry Hansen; James R. Burdett

[57] ABSTRACT

A method of producing high quality stoichiometric thin films of vanadium dioxide by reactive evaporation utilizes an electron beam to evaporate a source of vanadium in a controlled, low pressure oxygen gas environment with the film being deposited at a predetermined rate onto a substrate which is heated to and maintained at a predetermined temperature above 500° C.

1 Claim, 5 Drawing Figures

VANADIUM DIOXIDE FILM DEPOSITION

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

This invention relates generally to thin film technology and more particularly to a method of producing high quality vanadium dioxide ($VO_2$) thin films through a one-step reactive evaporation process.

It is generally known that $VO_2$ is one of several transition metal oxides which show an abrupt change in certain physical properties such as electrical resistance at a temperature $T_t$ (transition temperature). In $VO_2$, the transition is probably best described as a first-order semiconductor-to-metal transition accompanied by a lattice distortion with $T_t = 68°$ C. Because of this conveniently low transition temperature and the large drop in near infrared transmittance experienced by such films, $VO_2$ has been used in thermal relays, electrical switching elements, and optical storage media.

Prior to 1970, $VO_2$ thin films were usually produced by a variety of methods including pyrolysis, DC reactive sputtering, and a two-step physical evaporation of vanadium in an oxygen ambient followed by oxygen annealing. Since 1970, however, RF reactive sputtering has been used almost exclusively. While these processes produce a good quality film (i.e., a resistivity ratio of at least 5000), they nevertheless require complex monitoring of a large number of independent deposition variables and are relatively inflexible in their application with other simultaneous processes.

SUMMARY OF THE INVENTION

Accordingly, it is a general purpose and object of the present invention to provide high quality $VO_2$ thin films.

Another object is to provide a method of producing high quality $VO_2$ thin films which is simple to implement and requires a minimum of deposition variables.

Still another object is to provide high quality $VO_2$ thin films which are stoichiometric in nature.

Briefly, these and other objects of the present invention are accomplished through electron beam evaporation of vanadium onto a high temperature substrate which is maintained in a carefully controlled, low pressure oxygen gas environment.

Other objects, advantages, and novel features of the invention will become more apparent from the following detailed description of the invention when considered with the accompanying drawings wherein:

DETAILED DESCRIPTION OF THE INVENTION

Figure 1:
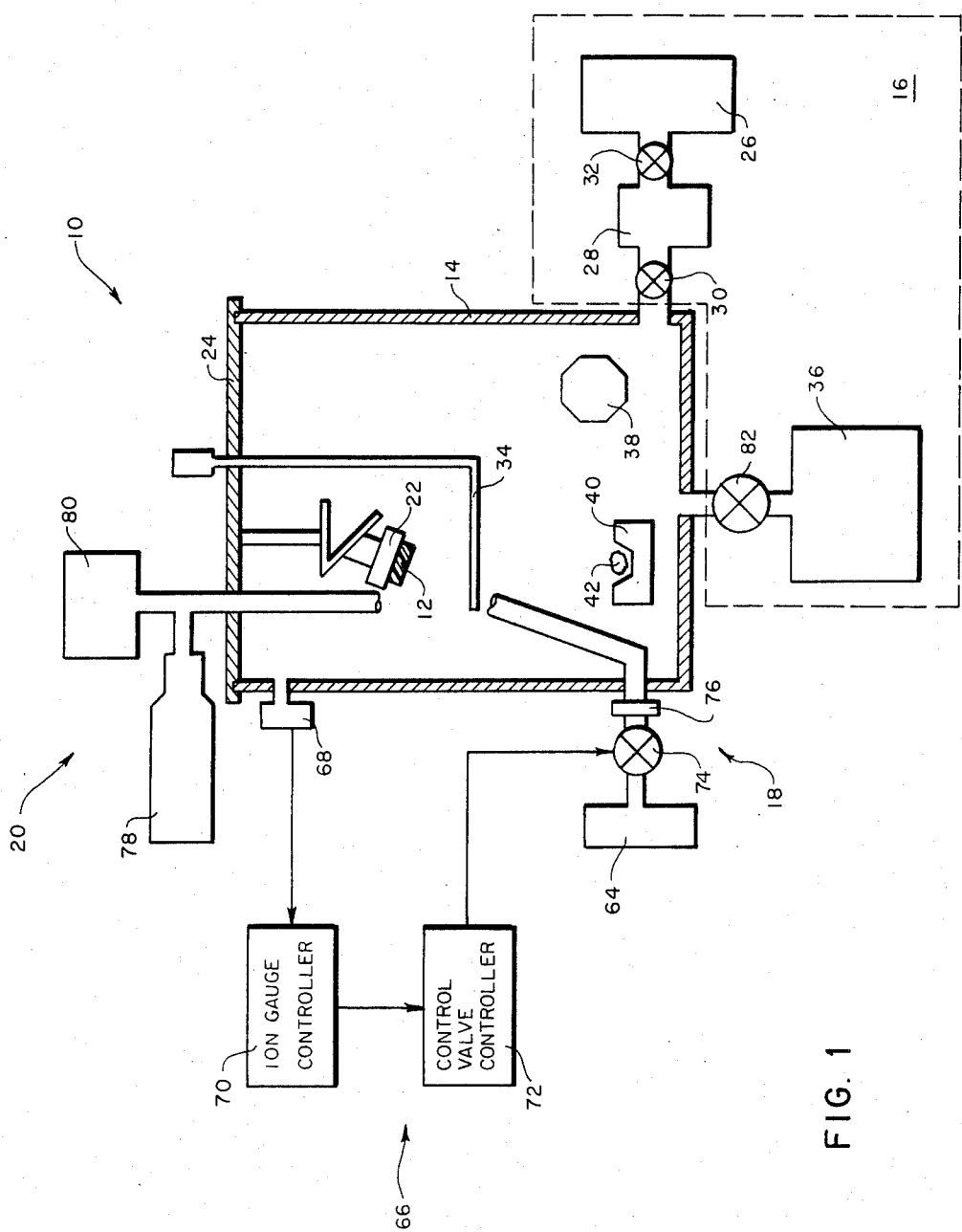
FIG. 1 is a diagram of cryopumped deposition system used to produce $VO_2$ thin films according to the present invention.

Referring now to the drawings, wherein like characters designate like or corresponding parts throughout the several views, there is shown in FIG. 1 a cryopumped deposition system 10 which may be used to reactively evaporate high quality $VO_2$ thin film on a substrate 12 according to the present invention. Including, in general, a vacuum chamber 14, an evacuation subsystem 16, an oxygen supply subsystem 18, and a residual gas analysis (RGA) subsystem 20, the deposition system 10 utilizes conventional, partially bakeable ultrahigh vacuum (UHV) equipment throughout with only minor modifications thereto in order to carefully control three specific process parameters: (1) substrate temperature; (2) oxygen pressure; and (3) the rate of vanadium deposition onto the heated substrate. For further information on such UHV systems, see Maissel, Leon J. and Reinhard Gland, ed., *Handbook of Thin Film Technology*, New York: McGraw-Hill Book Company, 1970.

Since it is not possible to deposit stoichiometric $VO_2$ on a room temperature substrate, the substrate is mounted to a thermal contact heater 22 attached to the top plate 24 of the chamber 14. The chamber 14 is then purged with dry nitrogen, sealed, and roughed down to approximately 400 mTorr by a mechanical roughing pump 26 which is isolated from the chamber 14 by a molecular sieve trap 28 installed between a trap isolation valve 30 and a roughing valve 32 in order to prevent oil back-streaming. A shutter 34 is locked in the closed position in order to prevent inadvertent deposition while all aspects of the deposition process are tested out before further pump down and bakeout.

During bakeout, a cryopump 36 is used in conjunction with a radiant heater 38 to draw the system's vacuum down to a practical base pressure of approximately $1 \times 10^{-7}$ Torr. The heater 38 is then shut off and, during cool down, a 270° deflection electron gun evaporation source 40 is run with a defocussed beam and at twice its nominal evaporation power to melt and flatten a chunk 42 of 99.7% parevanadium, the geometry of which is carefully selected to ensure that the diameter of the evaporating region top of the vanadium is one-ninth of the source-to-substrate distance. The substrate 12 is then heated to a temperature in the range of 500° C.–600° C. by the heater 22.

Figure 2:
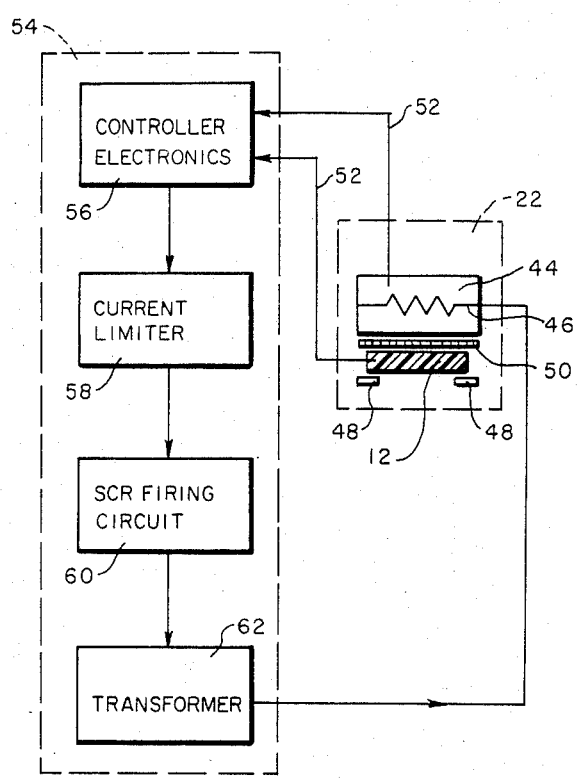
FIG. 2 is a block diagram of the temperature control feedback loop of FIG. 1.

As shown in greater detail in FIG. 2, the heater 22 includes a machined molybdenum block 44 which is heated by a tungsten filament evaporation source 46 having one of its ends grounded to the block 44 in a single-ended configuration. The substrate 12 is held in place by a pair of molybdenum mounting bars 48 with a 0.001 inch thick piece of soft aluminum foil 50 placed between the substrate 12 and the block 44 in order to increase thermal contact and ensure lateral uniformity. A pair of thermocouples 52, one of which is coupled to the substrate 12 and the other which is attached to the block 44, monitor the temperature gradient across the substrate and control its temperature by feeding their outputs back through a temperature control feedback loop 54, including a controller 56, a current limiter 58, an SCR (silicon-controlled rectifier) firing circuit 60, and a transformer 62.

Referring again to FIG. 1, while the substrate 12 is heated to its selected temperature, the electron gun 40 is run at low power and pure oxygen is supplied to the chamber 14 from a tank 64 at a rate of approximately 4 sccm as controlled by an oxygen control feedback loop 66. An ionization gauge 68, such as either a hot-cathode type of the Bayard-Alpert or Schulz-Phelps varieties or a cold-cathode type of the Penning variety, measures the total pressure (most of which is oxygen) inside the chamber 14 and provides the input to the feedback loop 66 via its controller 70. The output from the controller 70 is then fed to a second controller 72 which operates a flow control valve 74, the flow through which is monitored by a flowmeter 76, in order to maintain an oxygen partial pressure of greater than $5 \times 10^{-4}$ Torr.

While primarily used for residual gas analysis, the RGA subsystem 20 is also used to supplement the ionization gauge 68 in determining the oxygen pressure. Including a quadropole mass spectrometer 78 which is differentially pumped by a turbomolecular pump 80, the RGA subsystem 20 identifies gas species within the chamber 14 and determines their partial pressures. By assuming that the oxygen pressure within the chamber 14 is equal to the amount determined by the ionization gauge 68 multiplied by a constant, that constant approximating unity and being determined from the RGA spectra, only relative RGA peak heights need be used. That is, the higher the sum of the non-oxygen partial pressures relative to the oxygen, the smaller the proportionality constant. In this manner, the RGA subsystem 20 may be used to "fine tune" the oxygen control.

With the substrate 12 at its selected temperature and the control of oxygen pressure and substrate temperature initiated, the power of the electron gun 40 is gradually increased to its deposition set point, the shutter 34 opened, and deposition commenced at a rate of approximately one angstrom per second. Thereafter in approximately ten seconds, the deposition rate control as further described hereinbelow is initiated.

The process of maintaining oxygen pressure at approximately $1 \times 10^{-3}$ Torr as described above utilizes strictly upstream control. A variable orifice 82 installed between the cryopump 36 and chamber 14 is used in its nominally closed position, thus reducing the effective pumping speed at the chamber 14 by 250% while reducing oxygen consumption and at the same time lengthening the time interval between cyropump regenerations. However, downstream control of the oxygen pressure is possible by periodically adjusting the variable orifice 82 in the following manner. Deposition is begun with the orifice 82 completely closed and upstream control initiated. After five minutes, and every five minutes thereafter during deposition, the orifice 82 is opened slightly to maintain a constant flow, the pressure being controlled on a much shorter time scale. Thus, a long time constant manual downstream flow control could supplement the continuous and automatic upstream control.

Figure 3:
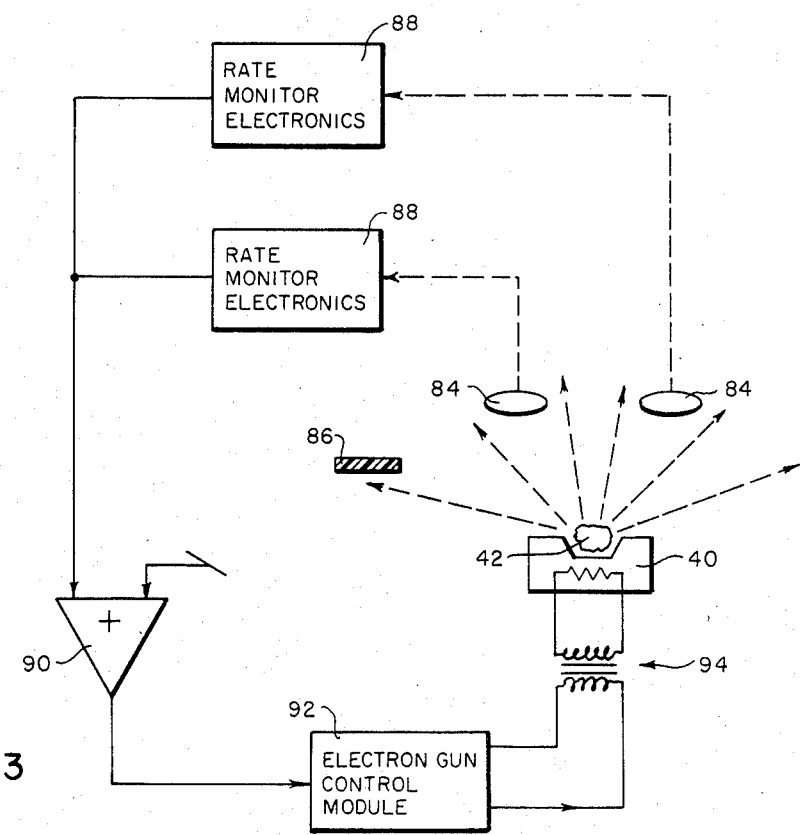
FIG. 3 is a block diagram of the evaporation feedback loop of FIG. 1.

Measuring the vanadium deposition rate, as shown in FIG. 3, is performed with a pair of quartz crystal rate monitors 84 in conjuntion with a calibration substrate 86. The indicated rates detected by the monitors 84 through their associated electronics 88 are averaged by an averaging circuit 90, the output from which is fed to an electron gun control module 82 to provide feedback control. Thus, the filament current of the electron gun 40 is varied through a transformer 94 while the high voltage is held constant.

Because most $VO_2$ films are too textured for direct thickness measurement, and since their thicknesses are functions of deposition variables other than merely the vanadium evaporation rate, the calibration substrate 86 was used. Including a glass slide coated with a vacuum grease such as Apiezon H which is mounted in close proximity to one of the monitors 84, the calibration substrate 86 obtains a measurable film during deposition at a rate which correlates closely to the true vanadium deposition rate. Moreover, the color of the calibration substrate 86 provides an additional check on the vanadium evaporation rate. For example, within a selected range of depositon variables, the calibration substrate 86 has a yellowish-green color. But, when either the oxygen pressure is raised 2% or the evaporation rate is lowered 5%, the color turns predominantly yellow.

Figure 4:
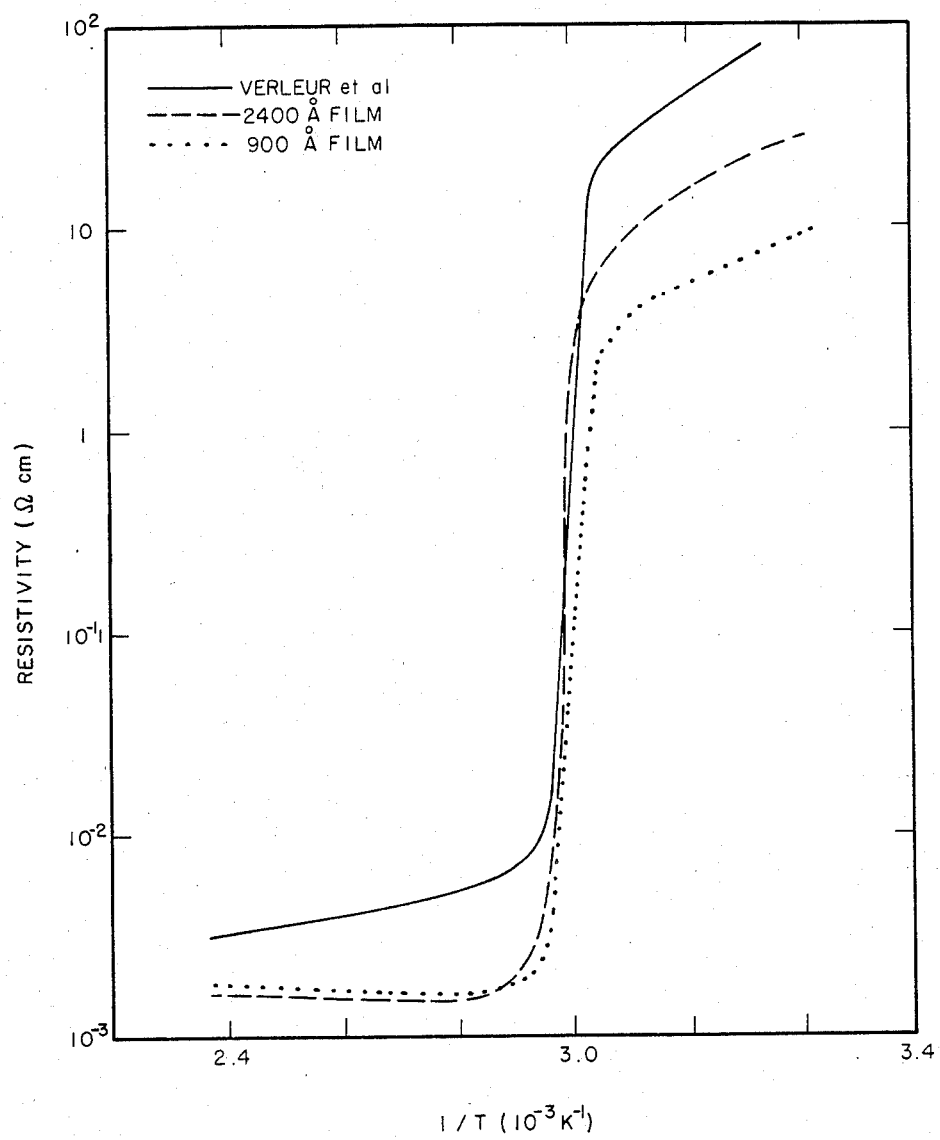
FIG. 4 illustrates the temperature dependent resistivity of $VO_2$ thin films according to the present invention.

The standard measure of the quality of a $VO_2$ thin film is the amplitude of the resistivity change or ratio that is observed when the material goes through its structural phase transition (see A. H. Griffiths and H. K. Eastwood, *J. Appl. Phys.* 45, 2201 (1974)). As shown in FIG. 4, where the temperature dependent resistivities of two different samples of $VO_2$ thin films which were reactively evaporated according to the present invention are compared to another sample which exhibits behavior quite similar to bulk $VO_2$ crystals as reported by Verleur et al in *Physical Review* Vol. 172, No. 3, Aug. 15, 1968, the resistivity change of all three samples (deposited on sapphire substrates) is on the order of $10^4$ However, one noteworthy difference shows up in the high temperature metallic phase where the reactively evaporated $VO_2$ thin films exhibit a positive temperature coefficient of resistivity (TCR). Such a positive TCR, while recognized as the signature of a true metal, has seldom if ever been seen in thin films in $VO_2$.

A family of 2000 Å thick films were deposited on fused quartz and sapphire substrates in accordance with the present invention. Those deposited on fused quartz, as expected, had lower resistivity ratios than those deposited on sapphire. Scanning electron microscopy (SEM) revealed that films on sapphire were better crystallized and had a larger mean grain size than those on fused quartz. Moreover, while the films on quartz substrates were relatively smooth, those on sapphire exhibited a considerable degree of surface texture. Both grain size and surface texture increased with deposition temperature, and X-ray diffraction studies typically showed a small suboxide peak in spite of the high quality nature of the films.

In order to study the optical properties of such well crystallized films, the degree of specularity of their reflectance and transmittance was determined by analyzing the diffuse, specular, and total reflectances and transmittances over the entire ultraviolet to near infrared spectrum. The films deposited on fused quartz were over 98% specular over the entire range, while those on sapphire were specular to that degree only for the near infrared, exhibiting 80% non-specularity in the ultraviolet with the crossover from specular to non-specular occuring near a wavelength of 600 nanometers.

The optical properties of such films were markedly dependent upon substrate temperature. For fused quartz and sapphire substrates heated to a range of 500° C.-550° C., "ordinary" $VO_2$ thin films were produced. Such films appeared "brass" colored in both semiconducting and metallic phases in transmitted light. But when the substrate temperature was raised by approximately 20° C., the $VO_2$ films showed large anomalies in their microstructural and optical properties. For example, SEM micrographs showed that the grain size enlarged to one micrometer. Furthermore, while such films in the semiconducting state appeared blue in both transmission and reflection, heating through the transition temperature resulted in a striking blue-to-red transition or transmission. The reflection color changes little. The largest anomaly, however, is a sevenfold increase in the total transmittance (on heating through the transition temperature) for the 600-800 nanometer range instead of a 50% decrease that occurs in "ordinary" films.

Figure 5A:
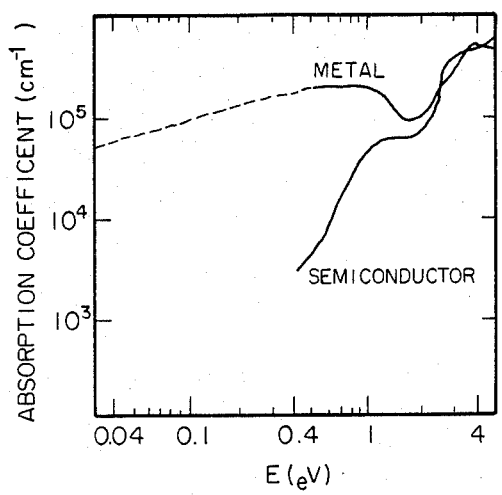
FIG. 5 illustrates the absorption coefficients of $VO_2$ thin films according to the present invention.
Figure 5B:
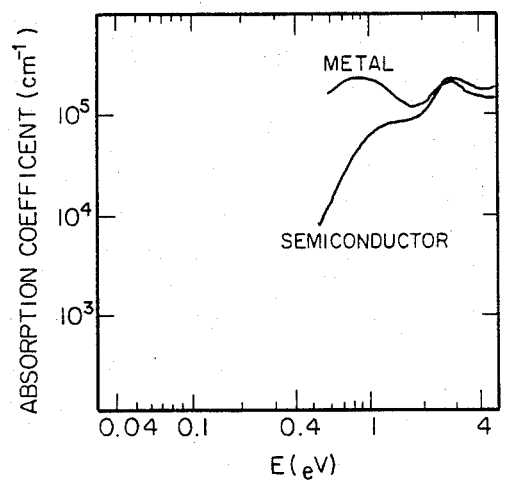
Figure 5C:
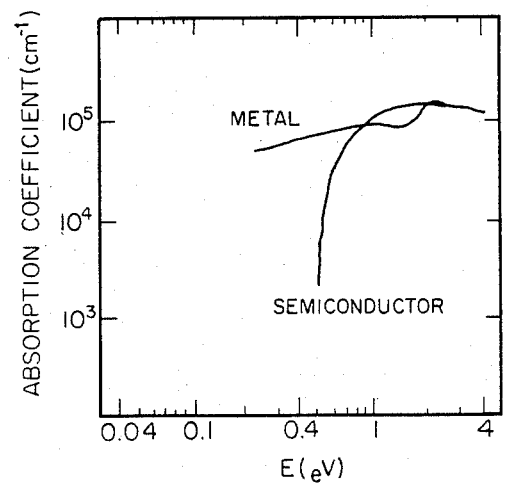

Referring now to FIGS. 5a-5c, such anomalies can be seen. Showing the optical absorption coefficient, $\alpha$, of bulk VO$_2$ crystals as reported by Verleur et al supra., FIG. 5a is quite similar to FIG. 5b which shows the absorption coefficient of an "ordinary" film deposited on a fused quartz substrate heated to from 500° C.-550° C. In both instances, $\alpha$ in the semiconductor state exhibits a gradual absorption edge in the 0.7 eV region with a second increase at approximately 2 eV. Moreover, at energy levels less than 2 eV, the $\alpha$ metal is greater than the $\alpha_{semi}$. On the other hand as shown in FIG. 5c, the semidonductor absorption edge for a blue-to-red film shifts slightly to the lower energies and the second edge at 2 eV is no longer apparent. The $\alpha_{metal}$ also strongly drops below $\alpha_{semi}$ in the 1 eV-2 eV range, accounting for the pronounced observable color change.

In order to produce such a blue-to-red transition film, the temperature of the substrate is maintained within the range of from 565° C. to 595° C., partial pressure of oxygen is maintained from $0.95 \times 10^{-3}$ Torr to $1.20 \times 10^{-3}$ Torr, and vanadium deposition rate maintained from 0.665 Å/sec to 0.735 Å/sec. Deviations from the above values produce VO$_2$ thin films with resistivity ratios on the order of $10^4$, but with a dark yellow color which is invariant through the structural phase transition.

Some of the many advantages of the invention should now be readily apparent. For example, a stoichiometric VO$_2$ thin film having a resistivity ratio of approximately $10^4$ and which exhibits a blue-to-red color change upon heating through the transition temperature is achieveable through a reactive evaporation process utilizing conventional UHV technology and carefully controlling three specific process parameters: (1) substrate temperature, (2) oxygen pressure; and (3) the rate of evaporation onto the heated substrate.

Obviously many modifications and variations of the present invention are possible in light of the above teachings. It is therefore to be understood that within the scope of the appended claim, the invention may be practiced otherwise than as specifically described.

What is claimed is:

1. A method of depositing a film of vanadium dioxide onto a substrate, comprising the steps of:

heating the substrate to a temperature of between 565° C. and 595° C.;

maintaining a low pressure oxygen gas environment, said environment having a practical base pressure of approximately $1 \times 10^{-7}$ Torr and an oxygen partial pressure controlled within a range of from $0.95 \times 10^{-3}$ Torr to $1.20 \times 10^{-3}$ Torr; and evaporating a source of pure vanadium in said environment such that the rate of film deposition upon the substrate is between 0.665 and 0.735 angstroms per second, whereby the film exhibits a blue-to-red change in transmission color upon heating through the transition temperature.

* * * * *